United States Patent [19]

Sakuma

[11] 4,287,526

[45] Sep. 1, 1981

[54] INSULATED GATE FIELD EFFECT TRANSISTOR

[75] Inventor: Hiraku Sakuma, Tokyo, Japan

[73] Assignee: Nippon Electric Co., Ltd., Japan

[21] Appl. No.: 128,376

[22] Filed: Mar. 10, 1980

Related U.S. Application Data

[63] Continuation of Ser. No. 903,564, May 8, 1978, abandoned.

[30] Foreign Application Priority Data

May 9, 1977 [JP] Japan .................................. 52/52857

[51] Int. Cl.³ .......................................... H01L 29/72
[52] U.S. Cl. .......................................... 357/23; 357/4; 357/22; 357/49; 357/89
[58] Field of Search ..................... 357/4, 22, 23, 49, 89

[56] References Cited

U.S. PATENT DOCUMENTS

3,997,908  12/1976  Schloetterer et al. ................. 357/22
4,087,902  5/1978  Feltner ................................... 357/23

Primary Examiner—Edward J. Wojciechowicz

[57] ABSTRACT

An insulated gate field effect transistor is disclosed. The transistor comprises an insulator body, a semi-conductor layer of one conductivity type formed on a surface of the insulator body, a pair of source and drain regions of the opposite conductivity type formed in the semiconductor layer along its one major surface and an extension region of the opposite conductivity type extending from one of the source and drain regions towards the remaining of the source and drain regions. A first insulating film is formed on the entire surface of the extension region, a gate insulating film is formed on a channel region of the transistor and a gate electrode is formed on the gate insulating film.

17 Claims, 14 Drawing Figures

INSULATED GATE FIELD EFFECT TRANSISTOR

RELATED APPLICATIONS

This is a continuation of U.S. Patent Application Ser. No. 903,564, filed May 8, 1978, now abandoned.

BACKGROUND OF THE INVENTION

1. Field of the Invention

The present invention relates to insulated gate field effect transistors, and more particularly, to insulated gate field effect transistors having a high breakdown voltage and a low on-resistance.

2. Description of the Prior Art

Insulated gate field effect transistors (IGFET's) have become increasingly popular as circuit elements for various integrated circuits because their manufacturing is simple and their integration is easy. A major drawback of these transistors, however, has been their low breakdown voltage as measured between the drain and substrate is (40–50 V for P-channel MOS transistors and 20–30 V for N-channel MOS transistors). This low breakdown voltage is due to field concentration in the proximity of a drain region and a gate electrode or the like. As a result the field of application for IGFET's has been limited mainly to digital circuits which are operable in the voltage range of 5–15 V. With the growing use of MOS integrated circuits, the need for high drain voltage operations has been enhanced, and several techniques for making insulated gate field transistors having a high breakdown voltage have been developed.

For example, with regard of silicon high voltage P-channel insulated gate field effect transistors having an ion implanted offset gate structure, even those having a drain breakdown voltage of about 250–300 V have been obtained. These insulated gate field effect transistors have such structure that a pair of source and drain regions are provided in one major surface of a bulk silicon substrate, a gate insulator film is formed on the one major surface of the substrate between the source and drain regions, an extension drain region is formed in the one major surface of the substrate as extended from the drain region towards the source region, and a gate electrode is provided on the gate insulator film at the channel section between the extension drain region and the source region.

In such transistors, since the gate electrode and the high concentration drain region do not overlap with each other in a plan projection, field concentration can be mitigated. Furthermore, the extension drain region formed by ion implantation which is essentially a low concentration impurity region, is pinched off as the drain voltage applied to the drain region is increased, so that it serves as a saturating register. Accordingly, the divided voltage applied across the channel section can be suppressed to a low value, and so, the drain breakdown voltage is enhanced.

Therefore, in an insulated gate field effect transistor having, on its drain side, an offset gate structure consisting of an extension drain region and a bulk silicon substrate adjacent thereto, the drain breakdown voltage can be enhanced, in principle, up to the proximity of the PN junction breakdown voltage by selecting the offset gate length (i.e., the length of the extension drain region) sufficiently long. The PN junction breakdown voltage is determined by the impurity concentration of the bulk silicon substrate.

However, in order to attain a still higher breakdown voltage using a transistor with the above-described structure, it is necessary to greatly sacrifice an "on-resistance" (a series resistance between a source and a drain when a transistor is in a conducting state). As a result of the foregoing the high breakdown voltage and the low on-resistance are mutually complicting factors.

On one hand it is desired that the impurity concentration of the substrate is as low as possible to increase the PN junction breakdown voltage between the drain region and the substrate. On the other hand, it is desirable to have a high ion dose implanted to the extension drain region (that is, the impurity concentration and distribution in said region as measured in the direction of the film thickness) since the ion dose determines the on-resistance of the transistor. However, since it is necessary that upon increase of the drawin voltage the extension drain region serving as a saturating resistor must be pinched off before the divided voltage that is applied across the effective MOS channel section reaches its insulation breakdown voltage (for instance; 40–80 V), the upper limit of the amount of electrically active impurities per unit area which can be doped into said region is determined by the impurity concentration of the bulk silicon substrate. In other words, the offset gate type transistors in the prior art had a disadvantage that if the impurity concentration of the substrate is lowered for attaining a high breakdown voltage of the transistor, then at the same time the ion dose implanted to the extension drain region must be also suppressed. Furthermore, since punch-through between the source and the drain becomes liable to occur by employing a low impurity concentration substrate, it is necessary to make the effective MOS channel section gate length sufficiently long to the extent of, for example, 16–20 $\mu$m, and so, the on-resistance at the effective MOS channel section also cannot be lowered.

Still further, in the case of N-channel insulated gate field effect transistors which necessitate a high substrate impurity concentration for an enhancement operation, realization of high voltage transistors having an offset gate structure was difficult. For instance, assuming that an impurity concentration of an N-type bulk silicon substrate is $(5-7) \times 10^{14}$ cm$^{-3}$, P+-ype source and drain regions having an impurity concentration of $10^{19}$–$10^{20}$ cm$^{-3}$ are formed in the substrate at a depth of 2.4 $\mu$m, a P-type extension drain region of 30 $\mu$m in length and 0.4 $\mu$m in depth is provided with an impurity concentration $2 \times 10^{16}$ cm$^{-3}$, and a channel length is selected to be 20 $\mu$m. Then a breakdown voltage of 250–300 V can be obtained, but a sheet resistivity R□ in the extension drain region becomes as high as 20 K$\Omega$/□–26 K$\Omega$/□, and therefore an on-resistance Ron of the transistor becomes a high level. On the other hand, if the impurity concentration of the extension drain region is selected to be, for example, $4 \times 10^{16}$ cm$^{-3}$ for the purpose of lowering the ON-resistance, the the sheet resistivity R□ of the extension drain region can be lowered to 10 K$\Omega$/□–16 K$\Omega$/□. However, in this case, in view of the necessity for the inherent operation of the offset gate structure transistors that the extension drain region must be pinched off before the divided voltage which is applied across the MOS channel section reaches the insulation breakdown voltage of that section, the impurity concentration of the bulk silicon substrate must be $3 \times 10^{15}$ cm$^{-3}$ or higher. Accordingly, the breakdown voltage takes a value of 100 V or lower, and no longer the transistor can be a high voltage MOS EFT.

In addition, the above-described prior art in which the substrate impurity concentration must be selected as low as $(5-7)\times 10^{14}$ cm$^{-3}$, is not adaptive to the N-channel NOS FET. If it is necessary to attain a further enhanced breakdown voltage, it is required to further lower the impurity concentration of the substrate, and thus it is necessitated to suppress the ion does implanted to the offset gate section to a lower value and to select the MOS gate length longer, so that the on-resistance of the insulated gate field effect transistors is inevitably raised. Such an offset gate type transistor in the prior art is disclosed, for example, in "Proceedings of the 6th Conference on Solid State Devices, Tokyo, 1974" Supplement to the Journal of the Japan Society of Applied Physics, Vol. 44, 1975 pp. 249-255.

BRIEF SUMMARY OF THE INVENTION

Therefore, it is one object of the present invention to provide an insulated gate field effect transistor in which a limit of a drain breakdown voltage in the prior art caused by junction breakdown between a drain region and a semiconductor substrate can be eliminated and a high breakdown voltage and a low on-resistance can be attained simultaneously.

Another object of the present invention is to provide an insulated gate field effect transistor having a large design freedom for a high breakdown voltage and a low on-resistance.

Still another object of the present invention is to provide an effective insulated gate field effect transistor in which a high breakdown voltage and a low on-resistance can be obtained with a short channel length.

Yet another object of the present invention is to provide an effective integrated circuit including an insulated gate field effect transistor having a high breakdown voltage and a low on-resistance.

According to one feature of the present invention there is provided an insulated gate field effect transistor comprising a semiconductor layer of one conductivity type formed on an insulator, a pair of source and drain regions of the opposite conductivity type having a high impurity concentration formed in said semiconductor layer along its one major surface, an insulating film formed on said one major surface between said source and drain regions, an extension region of the opposite conductivity type extending in said semiconductor layer along said one major surface from one of the source and drain regions towards the other region, said insulating film on a channel section between said extension region and said the other region serving as a gate insulating film, and a gate electrode formed on said gate insulator film.

According to another feature of the present invention there is provided the above-featured insulated gate field effect transistor, in which the effective amount of the impurity of said opposite conductivity type in an unit area of said extension region is substantially equal to the effective impurity amount of said one conductivity type in an unit area of the semiconductor layer portion of said one conductivity type under said extension region, that is, in the semiconductor layer portion sandwiched between said extension region and said insulator. Here the term "effective impurity amount" represent the amount of the impurity really used for (contributing to) pinch-off or deplete of the PN-junction formed between the extension region and the semiconductor layer.

Owing to the above-mentioned features of the present invention, in case where a reverse voltage is applied to said one of the source and drain regions with respect to the semiconductor layer and the voltage is increased, almost simultaneously with pinch-off of the extension region, the semiconductor layer portion under the extension region is changed to a depletion layer. In other words, the entire region of the offset gate section becomes a depletion layer.

Accordingly, the breakdown voltage between said one region having a high impurity concentraton and said semiconductor layer is determined by the intermediary of the depletion layer extending from the PN-junction formed between the extension region and the semiconductor layer in the direction perpendicular to the PN junction. Therefore, even if the impurity concentrations of the extension region is increased for attaining a low on-resistance and accordingly the impurity concentration of the semiconductor layer is also increased, the breakdown voltage is determined only by the length of the extension region regardless of these impurity concentrations.

According to still another feature of the present invention there is provided the above-featured insulated gate field effect transistor, in which the length of the extension region is made larger than the thickness of the semiconductor layer portion under the extension region, that is, the thickness of the semiconductor layer portion sandwiched between the extension region and the insulator.

Owing to the above-mentioned features of the present invention, the depletion layer extended from the PN junction between the extension region and the semiconductor layer is far larger than the depletion layer extended from the PN junction between the semiconductor layer and said one region having a high impurity concentration, and thus the former contributes to deplete the entire offset gate section comprising the extension region and the semiconductor portion under the extension region. Therefore, said one object of the present invention that the breakdown voltage for said one region is made independent of the impurity concentration, can be achieved.

Since the maximum effective impurity amount (the impurity amount used for depleting the PN junction) of the extension region is determined by the breakdown voltage of the semiconductor layer, e.g., the silicon crystal itself $(3-5\times 10^5$ V/cm), the maximum effective impurity amount per unit area in a plan projection is about $2-3\times 10^{12}$ cm$^{-2}$ where the semiconductor layer is formed of silicon. If a larger amount of impurity is doped into the extension region, then the PN junction formed between the extension region and the semiconductor layer will breakdown before the entire region of the offset gate section becomes the depletion layer. For the same reason, the upper limit of the effective impurity amount of the silicon semiconductor layer per unit area in a plan projection is also about $2-3\times 10^{12}$ cm$^{-2}$.

According to the present invention, although it is ideal to equalize the effective impurity amounts per unit area in a plan projection in the extension region (extension drain region) as well as in the semiconductor layer portion under said extension region to each other, that is, to equalize the numbers of the effective impurity atoms in the respective regions to each other, the effect of the present invention can be achieved even if a difference of 20% should exist therebetween. For a device having a breakdown voltage of 400 V or higher, it is favorable that the difference is 10% or smaller.

In a practical device, the effective impurity amount either in the extension drain region or in the semiconductor layer under said region becomes slightly larger, so that the either region should be depleted entirely in the direction of the film thickness at a low drain voltage, a part of the other region would slightly remain undepletedly. However, the effective impurity amount in this remained part is small, then the pinch-off or the depleting will proceed merely by raising the drain voltage slightly, and soon the entire region will be depleted. Therefore, substantially no problem occurs. Since the difference in the effective impurity amount is controllable to within 20% even if various deviations in the manufacture of practical devices such as, for example, fluctuations of the thickness and impurity concentration of the semiconductor layer, fluctuations in the thickness of the oxide film, fluctuations in the amount of ions contained in the oxide film, etc. are taken into consideration, and since even a control of the difference to within 10% is possible of ion implanation is employed for the formation of the low concentration extension (drain) region, the present invention can be easily practiced.

When the offset gate section is depleted in the direction of the thickness of the silicon film by a depletion layer extending in the direction of the thickness of the silicon film at a low pinch-off voltage, said offset gate section will be depleted almost over its entire region in the source-drain direction. In this case, the direction of electric field in the depletion layer is approximately the direction of the film thickness. Here, if a drain voltage higher than the pinch-off voltage is applied, the depletion layer extending from the drain region will slightly extend towards the effective MOS channel section, so that the electric field in the source-drain direction is a little enhanced. However, since the offset gate section is sufficiently long and since that section has been already depleted over its entire region, the increase in the electric field strength in the source-drain direction in the offset gate section in response to the increase in the drain voltage, is gradual, and thereby a high drain breakdown voltage can be realized.

Furthermore, according to the present invention, dielectrics such as sapphire or spinel can be used as the insulator on which the semiconductor layer is formed and an epitaxially grown layer that is grown on the surface of the dielectrics can be used as the semiconductor layer. If such SOS type structure is employed, isolation of the insulated gate field effect transistor from other devices can be achieved easily, so that the transistor according to the present invention can be advantageously applied to an integrated circuit device.

Still further, according to the present invention, a monocrystalline semiconductor region of one conductivity type can be provided on an insulating layer such as a silicon dioxide layer which is in turn provided on a plain surface or recessed surface of a polycrystalline silicon or other substrate. In this case, the monocrystalline semiconductor region, in which the above-described insulated gate field effect transistor is provided, can be made of a bulk silicon body, and therefore, a high voltage transistor having a small junction leakage current and a high yield can be obtained.

According to another feature of the present invention there is provided an semiconductor integrated circuit comprising an insulator and a plurality of insulated gate field effect transistors provided on the insulator as isolated from each other. The insulated gate field effect transistor includes a semiconductor layer formed on the insulator and figured an island, a pair of source and drain regions of the opposite conductivity type formed in the semiconductor layer along its one major surface, an extension drain region of the opposite conductivity type extending from the drain region towards the source region along the one major surface, an insulating film formed on the entire surface of the extension drain region, a gate insulating film formed on a channel region between the extension drain region and the source region, and a gate electrode formed on the gate insulating film.

DETAILED DESCRIPTION OF THE INVENTION

Figure 1:
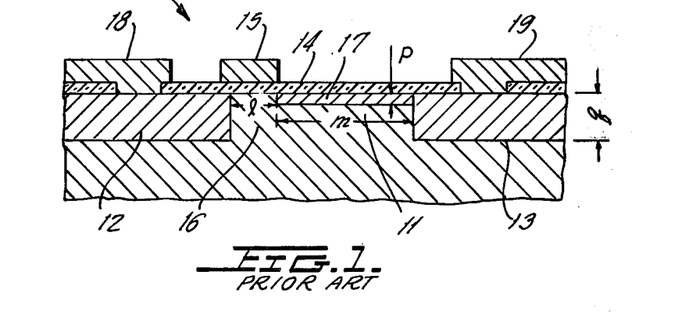
FIG. 1 is a cross-sectional view of a known offset type insulated gate field effect transistor.
Figure 2A:
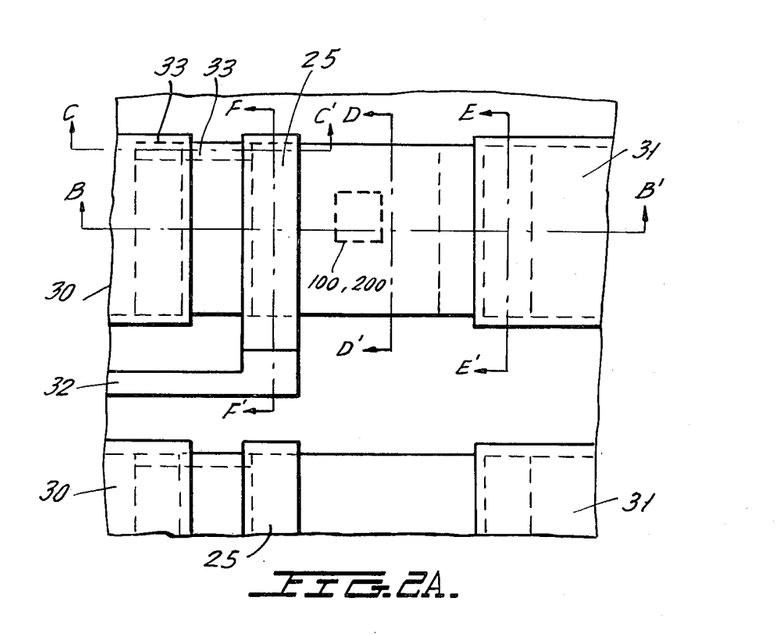
FIG. 2A is a plan view showing a first preferred embodiment of the present invention.
Figure 2B:
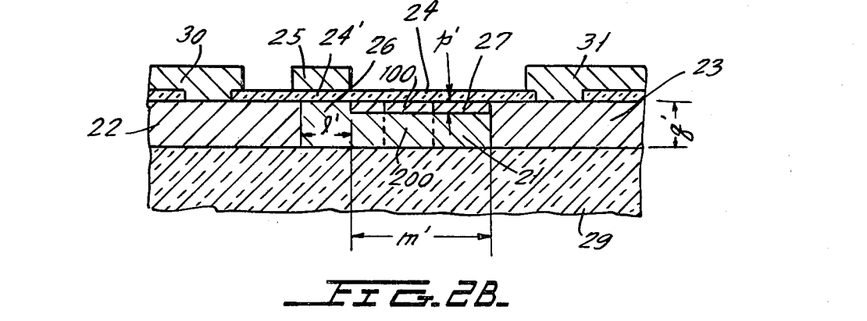
FIGS. 2B, 2C, 2D, 2E and 2F are cross-sectional views of the FIG. 2A taken along lines B—B', C—C', D—D', E—E' and F—F', respectively, and as viewed in the direction of the arrows.
Figure 2C:
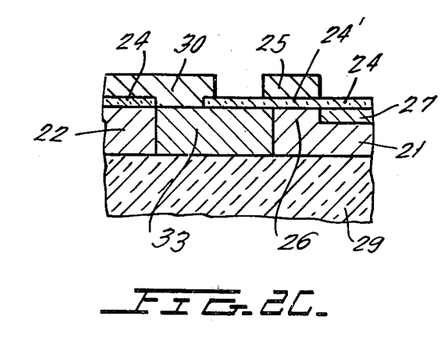
Figure 2D:
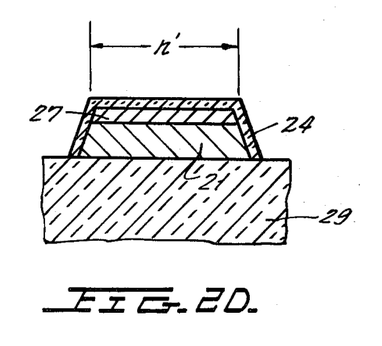
Figure 2E:
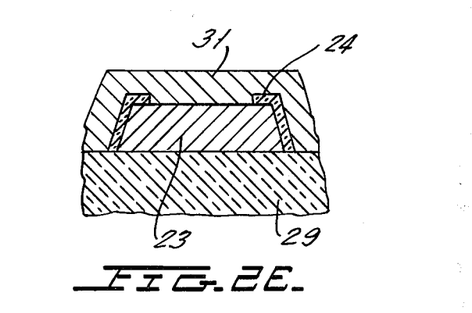
Figure 2F:
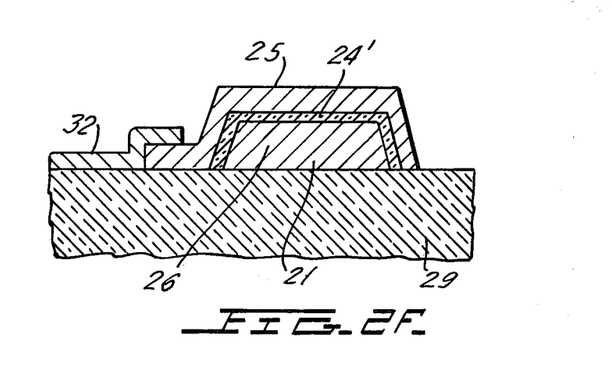

Referring now to the drawings, FIG. 1 shows a prior art metal oxide silicon field effect transistor 10. Transistor 10 comprises an N type bulk silicon substrate 11 having an impurity concentration of $5 \times 10^{14}$ cm$^{-3}$, a P+type source region 12 and a P+type drain region 13 having an impurity concentration of $1 \times 10^{19}$ cm$^{-3}$ at a depth q of 2.4 μm. A P type extension drain region 17 of 30 μm in length m and 0.4 μm in depth p having an impurity concentration of $2 \times 10^{16}$ cm$^{-3}$ is provided. A gate electrode 15 is formed on a gate insulator film 14 at the channel section, and a source electrode 18 and a drain electrode 19 are respectively connected to the source region 12 and drain region 13. When the substrate 11 and the source electrode 18 of such a MOS FET are gounded and a negative voltage (a reverse voltage) relative to the ground is applied to the drain electrode, breakdown occurs at a voltage of −250–300 V. This can be said to have a considerably high breakdown voltage. However, on the other hand, the sheet resistivity $R_\square$ of the extension drain region 17 of this device is as high as 20 KΩ/□–26 KΩ/□, and therefore an on-resistance Ron of the transistor at the conductive state becomes a high level.

FIRST EMBODIMENT

A first preferred embodiment of the present invention is illustrated in FIGS. 2A to 2F. According to this embodiment, a plurality of N-type silicon epitaxial films 21, having a film thickness q' of 2.4 μm and an impurity concentration of $8 \times 10^{15}$ cm$^{-3}$, serve as semiconductor layers and are formed on a dielectric insulator substrate such as a sapphire substrate 29. A P-type source region 22 and a P-type drain region 23 having an impurity concentration of $1 \times 10^{19}$ cm$^{-3}$ are formed in each of the N-type silicon epitaxial films 21 with a depth extending up to the substrate 29. Next, an insulating film 24 is formed with a thickness of 1400 Å and a gate electrode 25 made of polycrystalline silicon is formed on the insulator film 24. Then an insulator film section 24', just under the gate electrode 25, serves as a gate insulating film. A low impurity concentration region 27, forming an extension drain region in an offset gate section, is formed by ion implantation of boron at a concentration of $3-4 \times 10^{12}$ cm$^{-2}$ in a plan projection with an accelerating voltage of 40 KeV through the insulating film 24 of 1400 Å in thickness [which is, in this embodiment, a silicon thermal oxidation film] while employing the polycrystalline silicon gate electrode 25 as a mask for an effective MOS channel section 26 having a length l' of 20 μm. Then, for the purpose of activation of the implanted ions and recovery of the crystal defects generated during the implantation, annealing is effected for 30 minutes within a nitrogen atmosphere at 950° C. Thereby the P-type extension drain region is formed in the shape of 30 μm in length m', 0.4 μm in depth p' and 800 μm in width n' and with an effective impurity concentration of $1.6 \times 10^{12}$ cm$^{-2}$ in a plan projection. Thereafter, a source electrode 30, a drain electrode 31 and a gate lead-out electrode 32 made of aluminium are formed. It is to be noted that in this particular embodiment an N+-region 33 is provided for the purpose of connecting the N-type semiconductor layer 21 to a ground line so as to maintain the potentials to this region equally at the ground potential. However, even if this N+-region 33 is not provided and the N-type semiconductor layer 21 is not connected directly to an electrode, no problem will occur since when the source region 22 is connected to a ground line the N-type semiconductor layer 21 takes substantially the same potential.

Figures 3, 5:
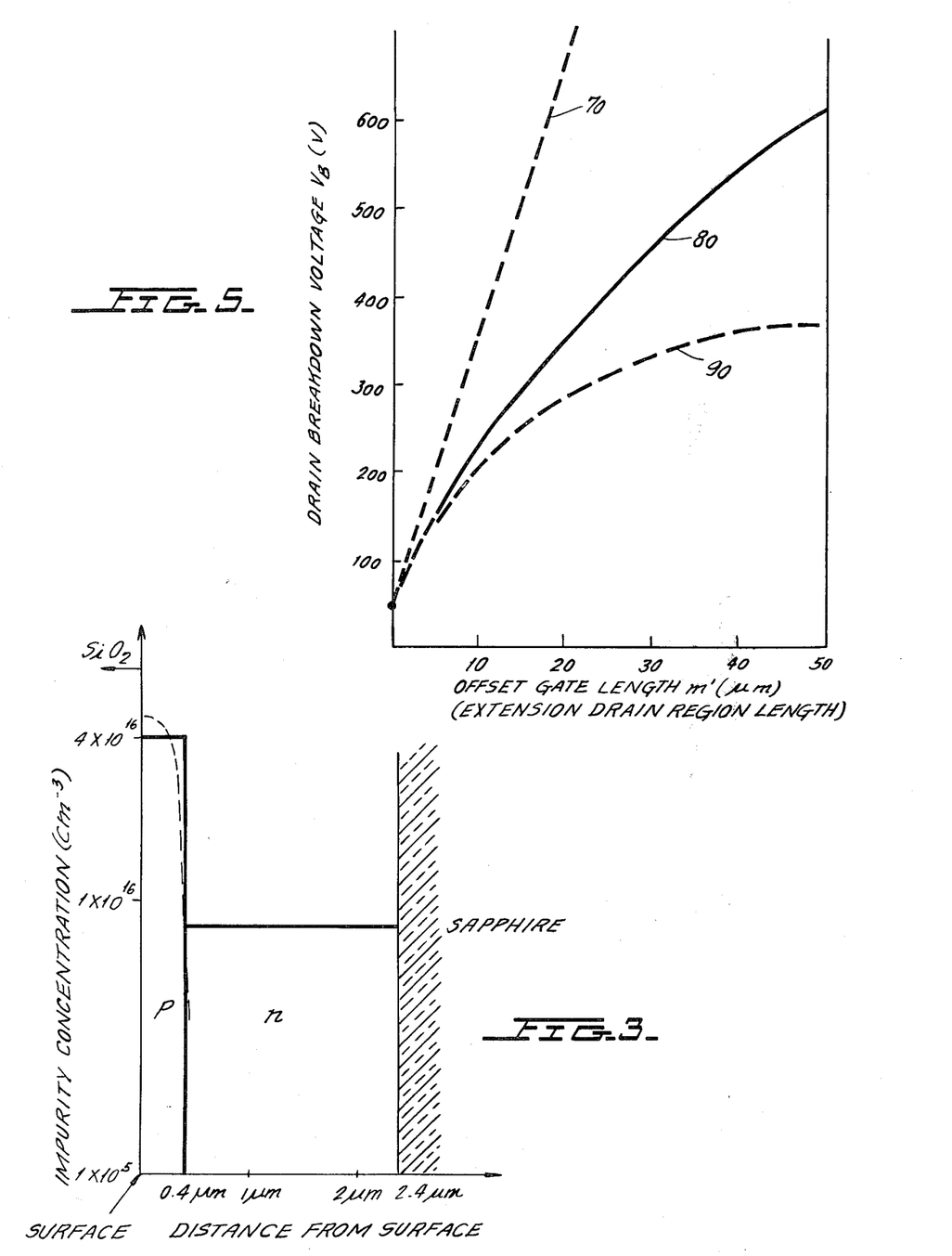
FIG. 3 is a diagram showing an impurity profile in the first preferred embodiment as plotted along the direction of the film thickness starting from the silicon surface.
FIG. 5 is a diagram showing a drain-breakdown voltage in the first preferred embodiment when the extension drawin length is varied and when the extension drain according to the present invention is not provided.

In FIG. 3 is shown an effective impurity profile in this preferred embodiment. When boron ions are implanted into the N region, that is, into the N-type semiconductor layer 21 having an impurity concentration of $8 \times 10^{15}$ cm$^{-3}$ and then heat treatment is effected, in the extension drain region appears a concentration distribution of P-type impurity as shown by a dotted line in FIG. 3. If this impurity concentration distribution is approximated by an average impurity concentration of $4 \times 10^{16}$ cm$^{-3}$ as shown by a solid line, then since the thickness p' of the extension drain region is 0.4 μm, the effective impurity concentration per unit area of the same region in a plan projection becomes equal to $4 \times 10^{16} \times 0.4 \times 10^{-4} = 1.6 \times 10^{12}$ cm$^{-2}$. On the other hand, the impurity concentration per unit area of the N-type semiconductor layer 21 under the extension drain region 27 in a plan projection is also equal to $8 \times 10^{15} \times 2 \times 10^{-4} = 1.6 \times 10^{12}$ cm$^{-2}$. Namely, the total amount of the effective impurity in the portion 100 of the extension drain region 27 and that in the portion 200 of the semiconductor layer 21 are substantially equalized to each other.

Figure 4A:
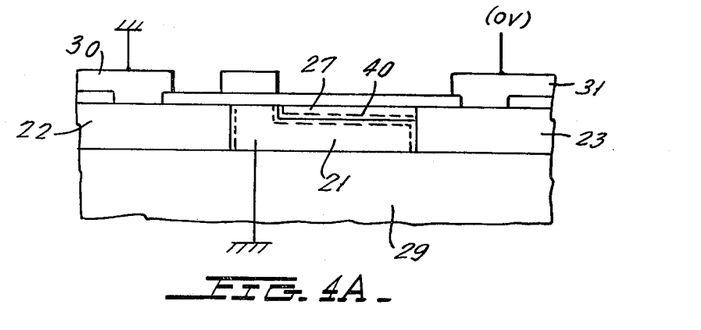
FIGS. 4A, 4B and 4C are cross-sectional views, similar to FIG. 2B, showing the states of a depletion layer when voltages of 0 V, −15 V and −30 V, respectively, are applied to a drain region relative to a semiconductor layer.
Figure 4B:
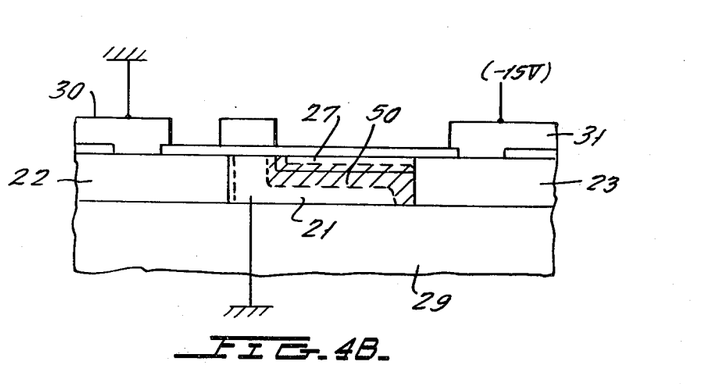
Figure 4C:
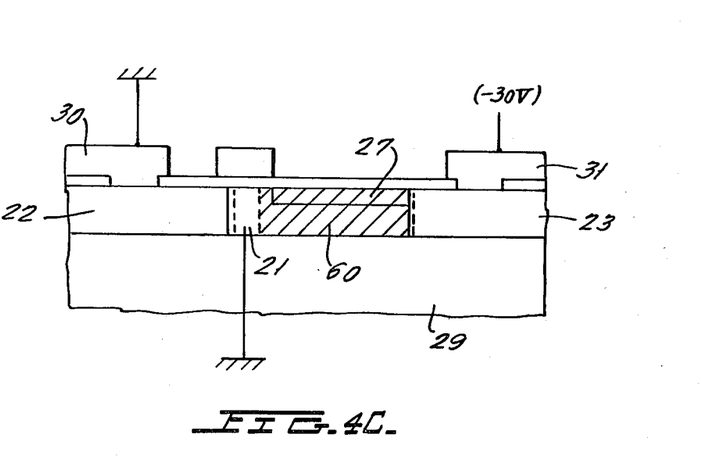

FIGS. 4A to 4C, respectively, show the states of a depletion layer 40, 50 and 60 when the source region 22 and the semiconductor layer 21 are kept at the ground potential (0 V) by connecting the source electrode 30 to the ground line while the drain electrode 31 is applied with the voltages of 0 V, −15 V and −30 V, respectively. Namely, as the extension drain region 27 is pinched off at −30 V, the divided voltage induced in the end of the extension drain region 27 at the channel section does not elevate, and at the same time the entire region of the offset gate section becomes a depletion layer so that even if the drain voltage is further increased, the increase of the electric field strength in the source-drain direction is gradual, and thereby a high drain breakdown voltage can be realized. In other words, the drain breakdown voltage is not related to the absolute values of the impurity concentrations in the respective regions in the offset gate section, but is determined only by the length of the offset gate section or the length of the extension drain region, that is, by the length m' of the extension drain region.

The effective drain breakdown voltage according to this preferred embodiment was about 460 V and the sheet resistivity $R_\square = \rho/p'$ of the extension drain region 27 was about 12 KΩ/$\square$. Where $\rho$ is specific resistivity of the region 27. These characteristics are far superior to the prior art technique.

In addition, experimental values of the drain breakdown voltage obtained when the length m' of the extension drain region 27 according to this preferred embodiment is varied while maintaining the other conditions identical, are represented by a solid line curve 80 in FIG. 5. As will be apparent from this diagram, if a drain breakdown voltage of 300 V is necessary, it is only required to shorten the length m' of the extension drain region to 15 μm, and in this case the on-resistance is naturally lowered to about one-half of the above-described embodiment.

A dotted line curve 70 in FIG. 5 represents the drain breakdown voltages when the total amount of the impurity in the extension drain region and the total amount of the impurity in the semiconductor layer under the same region are exactly equalized to each other. That is, this characteristic curve is obtained in case where the entire region consisting of the upper extension drain region and the lower semiconductor layer is simultaneously depleted as a whole. The reason why the curve 80 of the experimental data takes a little lower value than the curve 70 is because there exists a difference of about 10% between the total amounts of impurity in the unit area of the extension drain region and in the unit area of the semiconductor layer under the same region, respectively.

In the above mentioned experiment, the extension drain regions were confirmed to have higher impurities per unit area than that of the semiconductor layer about 10% by measuring the sheet resistivities. However, these experimental data present far higher breakdown voltages than those in the prior art. In addition, a dotted line curve 90 in FIG. 5 represents breakdown voltages when a difference of 20% exists. From these curves in FIG. 5 it is seen that even if a difference of 20% exists the insulated gate field effect transistor according to the present invention can be satisfactorily used as a high voltage device and that in the case of a device having a breakdown voltage of 400 V or higher it is favorable to suppress the difference in the total impurity amount to 10% or smaller.

SECOND EMBODIMENT

A P-type silicon epitaxial film having an impurity concentration of about $2\times10^{16}$ cm$^{-3}$ and a film thickness of about 1–1.5 μm is grown on a sapphire substrate, and by employing said epitaxial film, an N-channel MOS transistor having an offset gate structure similar to the first embodiment is manufactured. The manufacturing process is similar to the process described in connection to the first embodiment except for the fact that as a diffusion source for forming the source and drain regions having a high impurity concentration, phosphor is used.

Ion implantation of phosphor to the offset gate section is effected at a dose of about $8\times10^{12}$ cm$^{-3}$ with an accelerating voltage of 100 KeV to form a low concentration impurity region which constitutes the extension drain region. Annealing after the ion implantation is also effected to have the same effective impurities per unit area as the effective impurities per unit area of the silicon layer.

Despite of the fact that the impurity concentration itself of the P-type silicon epitaxial film is extremely increased, the drain breakdown characteristics of the offset gate type N channel MOS transistor according to this embodiment presented substantially similar trends to the first embodiment as shown in FIG. 5. For instance, in the case of the impurity concentration of $2\times10^{16}$ cm$^{-3}$, a breakdown voltage at a plane parallel junction assumed to be a one side step junction is about 35 V, whereas in the case of the N channel MOS transistor according to this embodiment which has an offset gate length of 30 μm a drain breakdown voltage of 450 V or higher was attained.

It is to be noted that though a thickness of a silicon epitaxial film of 1–2.4 μm was employed in the first and second embodiments, the same film thickness should be selected depending upon at what volts of the drain voltage the offset gate section is necessitated to be pinched off or depleted, taking into consideration the impurity concentration and distribution of the silicon epitaxial film and the extension drain region and the junction breakdown voltage in the direction of the film thickness in that case. Also it is to be noted that the gate insulator film under the gate electrode and the insulator film on the extension drain region in the above-described embodiments could be separate insulator films which are different from each other in film thickness, material, and the like.

THIRD EMBODIMENT

Figure 6A:
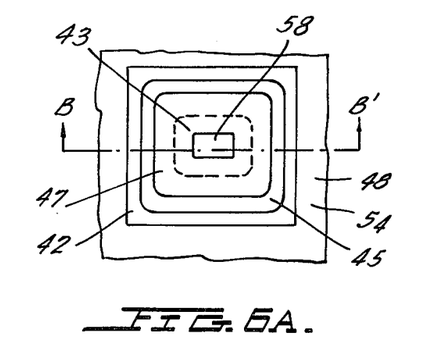
FIG. 6A is a plan view showing a third preferred embodiment of the present invention.
Figure 6B:
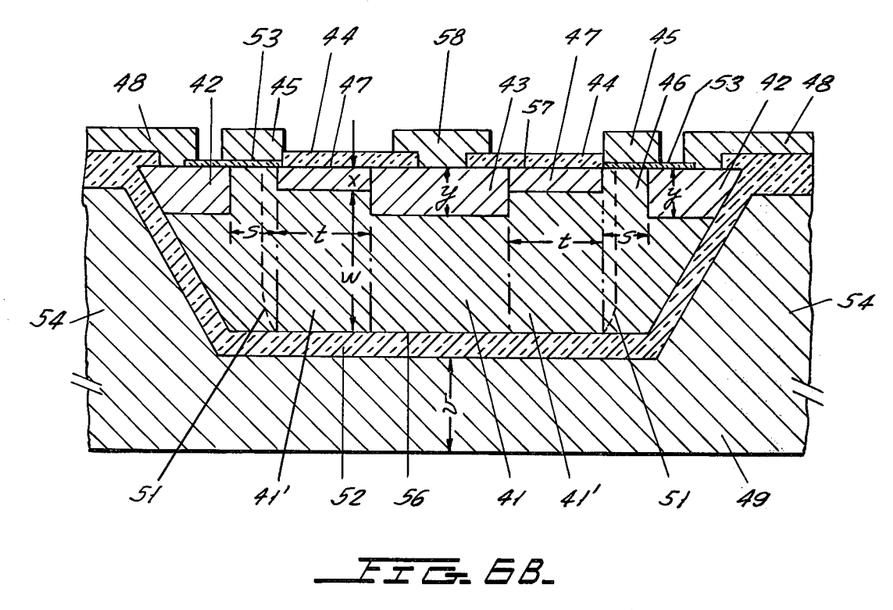
FIG. 6B is an enlarged cross-sectional view taken along line B—B' in FIG. 6A as viewed in the direction of arrows.

A third preferred embodiment illustrated in FIGS. 6A and 6B is manufactured through the following steps. Anisotropic etching is selectively carried out from a surface 56 of an N-type monocrystalline silicon substrate (this eventually forming an N-type semiconductor region 41) having an impurity concentration of $2\times10^{15}$ cm$^{-3}$, and thereby a groove 54 of square ring shape in a plan projection having a V-shaped cross-sectional configuration is formed. After an insulator oxidation film 52 of about 1 μm in thickness has been formed on one major surface 56 of the substrate and on the surface of the groove 54, polycrystalline silicon 49 is grown on said oxidation film 52 until the dimension v shown in FIG. 6B takes a value of about 200 μm. This polycrystalline silicon 49 forms a base body. Next, the other major surface of the monocrystalline silicon substrate is ground up to a surface 57, and then a P$^+$-type high concentration drain region 43 and a P$^+$-type high concentration source region 42 having a square ring-shaped configuration surrounding the former region are respectively formed with a depth y of 2 μm. On a gate insulator film 53 of about 1000 Å in thickness also having a square ring-shaped configuration is provided a square ring-shaped polycrystalline silicon gate electrode 45. By effecting ion implantation from the above of an insulator film 44 of about 3000 Å in thickness and carrying out heat treatment, formed is a square ring-shaped extension drain region 47 of 0.6 μm in depth x and 25 μm in length t and having an impurity concentration of $2\times10^{16}$ cm$^{-3}$. In this case, a MOS channel length s is equal to 20 μm. Thereafter, a drain electrode 58, a source electrode 48 and a gate lead-out electrode (not shown) are made of aluminium. In this preferred embodiment also, the total amount of the P-type impurity contributing to the pinch-off or the depleting in the extension drain region 47 and the total amount of the N-type impurity contributing to the pinch-off or the depleting in the portion 41' of the monocrystalline silicon substrate 41 under the extension drain region 47 are substantially equal to each other. Accordingly, when a reverse voltage is applied to the drain electrode 58 relative to the monocrystalline silicon substrate 41, as shown by a depletion layer boundary 51, the extension drain region 47 and the monocrystalline silicon substrate portion 41' under the former region which jointly constitute an offset gate section, are depleted over their entire region substantially at the same time. In this preferred embodiment, the drain breakdown voltage was experimentally proved to be about 400 V, and the sheet resistivity of the extension drain region 47 was 15 KΩ/□. Therefore, the on-resistance which appears when a forward current flows between the source and drain was lower value.

As described above, according to the present invention, the breakdown voltage between the semiconductor region of one conductivity type such as, for example, a silicon epitaxial film and the high concentration drain region of the opposite conductivity type in the insulated gate field effect transistor is not directly related to the impurity concentrations in these regions, but it is determined only by the length of the offset gate section or the length of the extension drain region. Therefore, for a given film thickness of a silicon epitaxial film, it is possible to raise the impurity concentration of the extension drain region in the offset gate section without lowering the drain breakdown voltage, so that an optimum design for attaining a low on-resistance can be achieved while maintaining a high drain breakdown voltage. Also, if necessary, the pinch-off voltage of the extension drain region can be lowered while retaining a low on-resistance. Likewise, since the substrate impurity concentration can be raised, punch-through at the effective MOS channel section can be suppressed, it becomes possible to realize a short channel in the effective MOS channel section, and thereby a current capacity of the transistor can be increased. Furthermore, in the case of the N-channel MOS transistors which necessitate to use a high impurity concentration substrate, an offset gate type high voltage transistor can be easily realized.

In addition, according to the present invention, both N-type and P-type high voltage offset gate type MOS transistors can be formed, if necessary, on the same chip together with other low voltage MOS IC's, through a manufacturing process which is completely exchangeable with that of the conventional MOS IC's and which is established by merely adding a step of providing a low concentration impurity layer to be used as an extension drain region (a step of ion implantation in the above-described embodiments) to a manufacturing process of the conventional MOS IC's for digital use. It is a matter of course that besides the transistors according to the present invention are additionally provided with advantages caused by the formation of the transistor on an insulator substrate such as easiness of wiring and device isolation, reduction of a parasitic capacitance, etc.

It is to be noted that while a silicon-sapphire substrate was used as a semiconductor film formed on a dielectrics substrate in the above-described first and second embodiments, the substrate material to be used for practicing the present invention, of course, need not be a silicon-sapphire substrate. For instance, as shown in the third embodiment, a substrate which comprises a silicon monocrystalline thin film formed on a polycrystalline silicon thick film by the intermediary of a silicon oxide film serving as an insulator, and which has been recently used for insulating separation of bipolar devices or the like, could be utilized, and further, semiconductors other than silicon could be used as the semiconductor thin film.

While MOS type field effect transistors which are most generally used at present were referred to in the explanation of the present invention and the description of its preferred embodiments above, upon practicing the present invention the gate insulator film could be insulator films other than the silicon terminal oxidation film such as, for example, a silicon nitride ($Si_3N_4$) film, an aluminium oxide ($Al_2O_3$) film, or a multi-layer film consisting of these insulator films. Furthermore, besides polycrystalline silicon, the gate electrode could be made of metals such as aluminium (Al), non-reactive molybdenum (Mo), tungsten (W), etc., or alloys such as, for example, platinum silicide. However, if polycrystalline silicon is employed, the annealing treatment after the ion implantation can be carried out at a higher temperature than in the case of employing aluminium. In addition, the manufacture of the insulated gate field effect transistor according to the present invention could be achieved without following the manufacturing steps described above in connection to its preferred embodiments, for example, after the extension drain region has been firstly formed the gate electrode could be formed, and as a matter of course various modifications could be made in the above-described manufacturing process. While the source region, drain region and channel region were formed in parallel to each other in a plan projection according to the first and second preferred embodiments, they could be arranged in a concentric ring-shaped pattern as is the case with the third preferred embodiment, or on the contrary, the arrangement of the respective regions in the above-described third preferred embodiment could be modified so that the respective regions may be arranged in parallel to each other in a plan projection as is the case with the first preferred embodiment.

What is claimed is:

1. An insulated gate field effect transistor, comprising:
   an insulator body having a generally planar major surface;
   a semiconductor layer of a first conductivity type formed on said insulator body major surface, said semiconductor layer having a generally planar, major surface lying parallel to said insulator body major surface;
   a source region of a second conductivity type, opposite of that of said first conductivity type, formed in said semiconductor layer along said major surface of said semiconductor layer;
   a drain region of said second conductivity type formed in said semiconductor layer along said major surface of said semiconductor layer and spaced from said source region with a channel region lying therebetween;
   an extension region of said second conductivity type formed in said semiconductor layer and extending from one of said source and drain regions to said channel region, said extension region having an impurity concentration lower than that of said one of said source and drain regions, one surface of said extension region being coincident with said major surface of said semiconductor layer, a second surface of said extension region being generally parallel to said insulator body surface and spaced therefrom such that a portion of said semiconductor layer lies between said second surface and said insulator body major surface, the total amount of effective impurity of said second conductivity type contained in said extension region being within a difference of 20 percent of the total amount of effective impurity of said first conductivity type contained in said semiconductor layer portion lying between said extension region and said insulator body;
   a first insulating film formed on the entire first surface of said extension region;
   a gate insulating film formed on said channel region; and
   a gate electrode formed on said gate film.

2. An insulated gate field effect transistor of claim 1, in which a total amount of effective impurity of said second conductivity type contained in said extension region differs from a total amount of effective impurity of said first conductivity type contained in said semiconductor layer portion located between said extension region and said insulator body by $-10\%$ or less, whereby the inverse breakdown voltage between said one of said source and drain regions and said semiconductor layer may withstand a voltage of 400 V or higher.

3. An insulated gate field effect transistor of claim 1, in which the length of said extension region as measured in a direction parallel to said insulator body major surface is larger than the thickness of the semiconductor layer portion lying between said extension region and said insulator body as measured in a direction perpendicular to said insulator body major surface.

4. An insulated gate field effect transistor of claim 1, in which the impurity concentration per unit area of said extension region as measured along a plane lying parallel to said insulator body major surface is $3 \times 10^{12}$ $cm^{-2}$ or lower.

5. An insulated gate field effect transistor of claim 1, in which said insulator body is formed of sapphire and said semiconductor layer is a layer grown on said sapphire.

6. An insulated gate field effect transistor of claim 1, in which said insulator body is a second insulating film provided on a polycrystalline silicon base body, and said semiconductor layer is a monocrystalline silicon and provided on said second insulating film.

7. An insulated gate field effect transistor of claim 1, in which said gate insulating film and said first insulating film are continuously formed.

8. An insulated gate field effect transistor of claim 1, in which said source region, said drain region and said channel region are arranged in parallel to each other as viewed along a plane lying parallel to said insulating body major surface.

9. An insulated gate field effect transistor of claim 1, in which said extension region, said channel region and said source region are arranged in a concentric ring-shaped pattern about said drain region at the center as viewed along a plane lying parallel to said insulating body major surface.

10. An integrated circuit device comprising an insulating member having a generally planar major surface and a plurality of insulated gate field effect transistors formed thereon, each of said transistors being isolated from the remaining said transistors and comprising:
 a semiconductor layer of a first conductivity type formed on said insulator body major surface, said semiconductor layer having a generally planar, major surface lying parallel to said insulator body major surface;
 a source region of a second conductivity type, opposite of that of said first conductivity type, formed in said semiconductor layer along said major surface of said semiconductor layer;
 a drain region of said second conductivity type formed in said semiconductor layer along said major surface of said semiconductor layer and spaced from said source region with a channel region lying therebetween;
 an extension region of said second conductivity type formed in said semiconductor layer and extending from one of said source and drain regions to said channel region, said extension region having an impurity concentration lower than that of said one of said source and drain regions, one surface of said extension region being coincident with said major surface of said semiconductor layer, a second surface of said extension region being generally parallel to said insulator body surface and spaced therefrom such that a portion of said semiconductor layer lies between said second surface and said insulator body major surface, the total amount of effective impurity of said second conductivity type contained in said extension region being within a difference of 20 percent of the total amount of effective impurity of said first conductivity type contained in said semiconductor layer portion lying between said extension region and said insulator body;
 a first insulating film formed on the entire first surface of said extension region;
 a gate insulating film formed on said channel region; and
 a gate electrode formed on said gate film.

11. An integrated circuit device of claim 10, in which said insulator member is a sapphire substrate and each of said semiconductor layers is provided thereon in the form of an individual island.

12. An insulated gate field effect transistor, comprising:
 an insulator body;
 a semiconductor layer of one conductivity type on a surface of said insulator body;
 a source region and drain region, each of the opposite conductivity type, formed in said semiconductor layer and extending from a first major surface of said semiconductor layer to a second major surface of said semiconductor layer which is adjacent said surface of said insulator body;
 an extension region of said opposite conductivity type formed in said semiconductor layer and extending from one of said source and drain regions towards the other of said source and drain regions, said extension region having an impurity concentration lower than that of said one of said source and drain regions, said extension region extending from said first major surface of said semiconductor layer into said semiconductor layer but not reaching said insulator body surface such that a portion of said semiconductor layer is located between said extension region and said insulator body;
 a channel region positioned between said extension region and the other of said source and drain regions;
 a gate insulating film formed on said channel region; and
 a gate electrode formed on said gate insulating film and not extending over said extension region.

13. An insulated gate field effect transistor of claim 12, in which a total amount of effective impurity of the opposite conductivity type contained in said extension region differs from a total amount of effective impurity of said one conductivity type contained in said portion of said semiconductor layer only by ±20% or less.

14. An insulated gate field effect transistor of claim 12, in which a total amount of effective impurity of the opposite conductivity type contained in said extension region differs from a total amount of effective impurity of said one conductivity type contained in said portion of said semiconductor layer only by ±10% or less, whereby the inverse breakdown voltage between said one of said drain and source regions and said semiconductor layer may withstand a voltage of 400 V or higher.

15. An insulated gate field effect transistor, comprising:
 an insulator body;
 a semiconductor layer of a first conductivity type on a surface of said insulator body;
 a source region and a drain region, each of a second conductivity type opposite that of said first conductivity type, formed in said semiconductor layer at spaced locations along a major surface of said semiconductor layer;
 an extension region of said second conductivity type formed in said semiconductor layer and having a first surface lying along said major surface and a second surface spaced from said major surface and forming a PN junction with a portion of said semiconductor layer, said PN junction being substantially parallel with said major surface, said extension region extending from one of said source and drain regions but stopping short of said other of said source and drain regions such that a channel region is located between said extension and said other of said source and drain regions, said extension region having an impurity concentration lower than that of said source and drain regions;

an insulating gate film formed on the entire surface of said first surface;

a gate insulating film formed on said channel region; and a gate electrode formed on said insulating film, one end of said gate electrode being substantially aligned with that end of said extension region which is remote from said one of said source and drain regions.

16. An insulated gate field effect transistor, comprising:

an insulator body;

a semiconductor layer of one conductivity type on a surface of said insulator body;

a source region and drain region, each of the opposite conductivity type, formed in said semiconductor layer and extending from a first major surface of said semiconductor layer to a second major surface of said semiconductor layer which is adjacent said surface of said insulator body;

an extension region of said opposite conductivity type formed in said semiconductor layer and extending from one of said source and drain regions towards the other of said source and drain regions, said extension region having an impurity concentration lower than that of said one of said source and drain regions, said extension region extending from said first major surface of said semiconductor layer into said semiconductor layer but not reaching said insulator body surface such that a portion of said semiconductor layer is located between said extension region and said insulator body, the total amount of effective impurity of said opposite conductivity type contained in said extension region being less than 120 percent and more than 80 percent of the total amount of effective impurity of said first conductivity type contained in said portion of said semiconductor layer located between said extension region and said insulator body;

a channel region positioned between said extension region and the other of said source and drain regions;

a gate insulating film formed on said channel region; and a gate electrode formed on said gate insulating film and not extending over said extension region.

17. An insulated gate field effect transistor, comprising:

an insulator body;

a semiconductor layer of a first conductivity type on a surface of said insulator body;

a source region and a drain region, each of a second conductivity type opposite that of said first conductivity type, formed in said semiconductor layer at spaced locations along a major surface of said semiconductor layer;

an extension region of said second conductivity type formed in said semiconductor layer and having a first surface lying along said major surface and a second surface spaced from said major surface and forming a PN junction with a portion of said semiconductor layer, said PN junction being substantially parallel with said major surface, said extension region extending from one of said source and drain regions but stopping short of said other of said source and drain regions such that a channel region is located between said extension and said other of said source and drain regions, said extension region having an impurity concentration lower than that of said source and drain regions, the total amount of effective impurity of said second conductivity type contained in said extension region being within a difference of 20 percent of the total amount of effective impurity of said first conductivity type contained in said portion of said semiconductor layer lying between said extension region and said insulator body;

an insulating gate film formed on the entire surface of said first surface;

a gate insulating film formed on said channel region; and a gate electrode formed on said insulating film, one end of said gate electrode being substantially aligned with that end of said extension region which is remote from said one of said source and drain regions.

* * * * *